(12) United States Patent
Yamaguchi et al.

(10) Patent No.: US 6,781,202 B2
(45) Date of Patent: Aug. 24, 2004

(54) SEMICONDUCTOR DEVICES AND THEIR FABRICATION METHODS

(75) Inventors: Ken Yamaguchi, Fuchu (JP); Yoshiaki Takemura, Sagamihara (JP); Kenichi Osada, Kawasaki (JP); Masatada Horiuchi, Koganei (JP); Takashi Uchino, Southampton (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/303,884

(22) Filed: Nov. 26, 2002

(65) Prior Publication Data

US 2003/0137012 A1 Jul. 24, 2003

(30) Foreign Application Priority Data

Jan. 22, 2002 (JP) ......................................... 2002-012730

(51) Int. Cl.$^7$ ............................................... H01L 29/76
(52) U.S. Cl. ........................ 257/336; 257/337; 257/220
(58) Field of Search ................................... 257/220–337

(56) References Cited

U.S. PATENT DOCUMENTS 6,274,901 B1 * 8/2001 Odake et al. ................ 257/315
6,461,920 B1 * 10/2002 Shirahata et al. ........... 438/276

* cited by examiner

Primary Examiner—Fetsum Abraham
(74) Attorney, Agent, or Firm—Antonelli, Terry, Stout & Kraus, LLP

(57) ABSTRACT

A higher-performance short channel MOS transistor with enhanced resistance to soft errors caused by exposure to high-energy rays is realized. At the time of forming a deep source/drain diffusion layer region at high density, an intermediate region of a density higher than that of impurity of a semiconductor substrate is formed between the source/drain diffusion layer and the semiconductor substrate of a conduction type opposite to that of the source/drain diffusion layer. The intermediate region is formed with a diffusion window for forming the source/drain, an intermediate layer of uniform concentration and uniform width can be realized at low cost.

16 Claims, 11 Drawing Sheets

FIG. 1
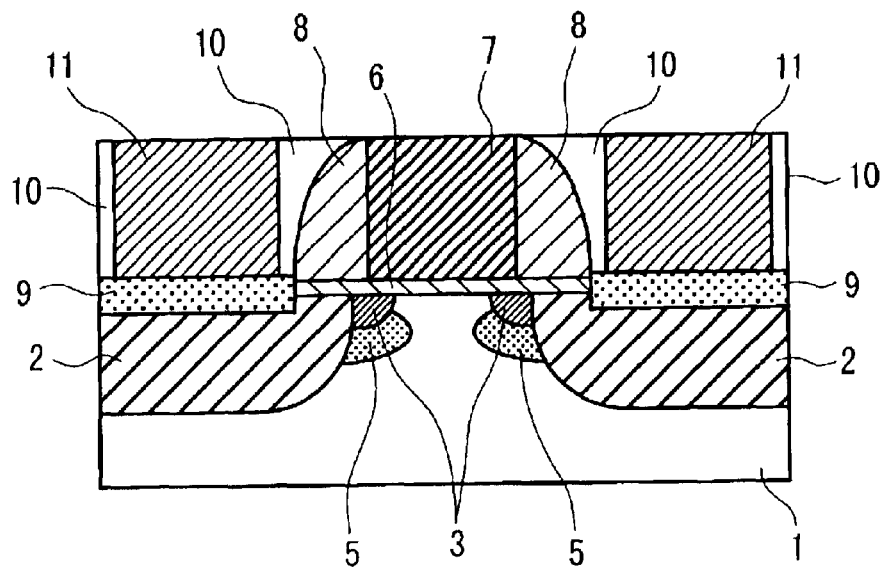
FIG. 2A
CMOS
FIG. 2B
ALPHA-PARTICLE-INDUCED
SRAM
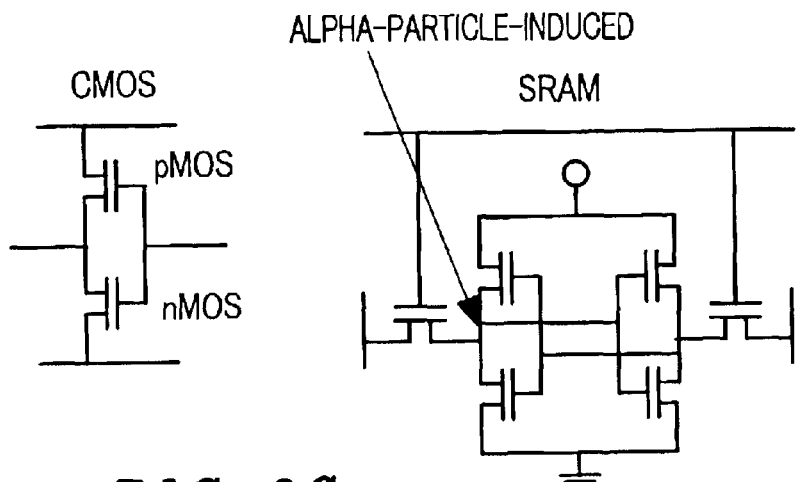
FIG. 2C
CMOS
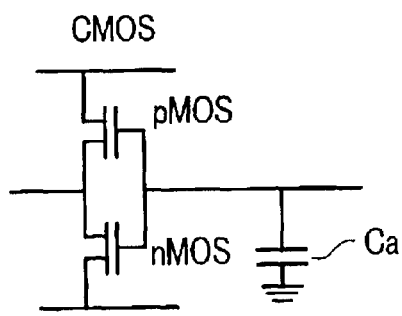

SEMICONDUCTOR DEVICES AND THEIR FABRICATION METHODS

FIELD OF THE INVENTION

The present invention relates to semiconductor devices and their fabrication methods and, more particularly, to improvement in resistance to soft errors in an ultra-small insulated gate field-effect transistor.

BACKGROUND OF THE INVENTION

The performance of an insulated gate field-effect transistor (hereinbelow referred to as MOSFET) as a component of an integrated circuit device of a very high packing density has been being increased by reduction in structural dimensions in accordance with the scaling law. Specifically, as the size of the structure is reduced, a mutual conductance $g_m$ indicative of the amplification factor of the MOSFET increases and higher-density integration is realized at the same time. The scaling law contributes to even decrease in a power voltage and promotes higher-speed operation, higher packing density, and lower power operation at the same time.

FIG. 1 is a schematic diagram showing a cross section of a representative configuration example of a conventional ultra-small MOSFET. Shown in FIG. 1 are a semiconductor substrate 1, a deep source/drain diffusion layer 2, a shallow source/drain diffusion layer (called an extension) 3, a locally high-density doping region 5 also called a pocket, a gate insulating film 6, a gate electrode 7, a gate side wall insulating film 8, a silicide film 9, a surface passivation insulating film 10, and a source/drain electrode 11. The diagram shows an example of an ultra-small MOS having a double diffusion structure for realizing a source/drain of a low-resistance and a shallow junction.

As the MOS structure is decreasing in size, a kind of conduction phenomenon called punch-through appears between the source and drain and it is a factor of preventing the MOS structure from decreasing in size. As means for solving the problem, developments for a shallower source/drain junction and the locally high-density doping technique of a channel region have been being promoted.

On the other hand, as shown in FIG. 2A, as a technique maximally utilizing the performance of a MOSFET and realizing a higher-performance function, a complementary circuit configuration (complementary-MOSFET: CMOS) in which an n conduction type MOSFET (nMOS) and a p conduction type MOSFET (pMOS) are connected in series has been proposed and is widely used. A flip flop formed by combining two complementary circuits is widely used as a memory device (static random access memory, hereinbelow, abbreviated as SRAM) FIG. 2B shows the circuit configuration of the SRAM.

Because of its configuration of the bistable circuit, it is said that the SRAM is stable against an unexpected disturbance and noise from the outside. In recent years, however, a lower voltage is used for reduction in power consumption and an erroneous operation due to an external disturbance, particularly, high-energy rays emitted irregularly from outer space is sometimes recognized. For example, as shown by the arrow in the SRAM of FIG. 2B, the SRAM is irradiated with alpha-particles, so that an output of the CMOS is shifted to a low potential although for extremely short time, causing inversion of data stored in the SRAM or the like. One of methods of preventing the phenomenon is a method of adding a capacitance which absorbs occurrence of an abnormal voltage. To be specific, as shown in FIG. 2C, a tank (capacitor) for temporarily storing electrons or holes generated by the irradiation of alpha particles is provided. By adding a capacitance Ca on the output side of a CMOS, a potential drop can be prevented. However, there is a problem that the operation speed of the whole SRAM is decreased.

FIG. 3 shows a result of analysis by device simulation, of changes in outputs in the case where the capacitance Ca is added to the output side of the CMOS and the CMOS is irradiated with alpha particles. As obviously understood from comparison between the case where the additional capacitance Ca is not provided and the case where the additional capacitance Ca is provided, by the additional capacitance Ca of about 0.7 fF, shift to a lower potential due to the alpha-particles induced is suppressed. From the viewpoint of stability of the operation of the SRAM, it can be said that even reduction of such a degree produces an effect. To be more reliable, the additional capacitance Ca of about 1.8 fF is effective. As described above, by adding the capacitance on the output side of the CMOS, it is understood that a drop in the potential can be prevented and resistance to alpha particles can be improved. However, the method has a problem that the operation speed of the whole SRAM deteriorates.

Methods of preventing a generated electron-hole pair from arriving at an active region of a semiconductor device by making a layer-state breakwater are disclosed in Japanese Unexamined Patent Application Nos. 59-84461 and 59-94451. According to the methods, a high-density impurity region serving as a breakwater is formed so as to have a layer structure (hereinbelow, called a layer-shaped breakwater) in a lower region of the active region. In the former method, a high-density doped layer serving as a layer-shaped breakwater is formed so, as not to be in contact with a source/drain region of high density. In the latter method, the high-density doped layer is formed so as to be in contact with the source/drain region of high density. Whether the high-density doped layer is in contact or not exerts an influence on a capacitance value in a semiconductor device but the effect of a soft error protection is the same.

Cosmic rays incident from the outside of a semiconductor device have no regularity and no order in the incident direction and position so that generation of an electron-hole pair by irradiation of high-energy rays cannot be prevented. That is, when a semiconductor device is irradiated with cosmic rays, exposure positions in the semiconductor device completely have no order. Therefore, whether the high-energy rays pass through the center portion from right above as in the known techniques or the peripheral portion of a MOS cannot be specified. When the rays pass through the center portion from right above, the conventional layer-shaped breakwater effectively acts. However, when the rays pass through the peripheral portion, the flow of electrons and holes generated in association with the exposure in a well is not blocked by the layer-shaped breakwater but the electrons and holes easily reach the active region of the MOS. That is, the layer-shaped breakwater cannot always sufficiently deal with occurrence of a soft error.

The cosmic rays that cause a soft error are a natural phenomenon and cannot be prevented from being generated. Consequently, it is desired to prevent irradiation of high-energy rays. However, some cosmic rays such as neutron rays penetrate even one meter of concrete, so that it is unrealistic to completely block the cosmic rays. It is therefore necessary to take some countermeasure for the semiconductor itself. As described above, the structure including the layer-shaped breakwater for preventing the electrons and holes generated at the time of exposure to high-energy rays from being diffused to the active region is known by Japanese Unexamined Patent Application Nos. 59-84461 and 59-94451 and the like.

However, it is troublesome that the incident directions and positions of cosmic rays that cause a soft error do not have regularity. When the center portion of the MOS is exposed to the high-energy rays, the layer-shaped breakwater can effectively plays its role but when the high-energy rays are incident on the peripheral portion, as described above, a problem arises such that the flow of the electrons and holes cannot be effectively blocked.

An object of the invention is to provide a semiconductor device having high resistance to a soft error which is caused by high-energy rays from outer space and high-performance driving capability.

SUMMARY OF THE INVENTION

To more specifically describe an erroneous operation caused by cosmic rays, particularly, alpha particles and a pn junction as a basic configuration of the invention, FIG. 4 schematically shows a state where a pn junction is irradiated with alpha particles. Shown in FIG. 4 are a region 1 of a first conduction type, an impurity region 2 of a second conduction type in which impurity is diffused deep at high density, and an impurity region 3 of the second conduction type in which impurity is diffused shallow. A pn junction is formed between the region 1 of the first conduction type and the impurity region 2 of the second conduction type of high density and deep diffusion, and a pn junction is formed between the region 1 of the first conduction type and the impurity region 3 of shallow diffusion. According to the invention, in such a structure, an impurity region 4 of the fist conduction type of higher density than the impurity density of the region 1 of the first conduction type is provided between the region 1 of the first conduction type and the region 2 of the second conduction type. The thickness of the impurity region 4 of the first conduction type is suppressed so as not to cover the impurity region 3 of the second conduction type of shallow diffusion. In such a manner, the width of a depletion layer formed between the region 1 of the first conduction type and the region 2 of the second conduction type can be set to be narrow and uniform.

In the case where a semiconductor device is irradiated with alpha particles, the energy is dissipated and it newly generates an electron-hole pair in the semiconductor. The generated electron-hole pair in an initial state is electrically neutral from a macroscopic viewpoint. With a lapse of time, electrons and holes are diffused into the semiconductor (usually, diffused in opposite directions) and cause an abnormal potential in the semiconductor. When the abnormal potential is smaller than a power source voltage, there is no problem. However, as described above, when the power source voltage is decreased for reduction in power and the abnormal potential becomes unignorable, the abnormal potential becomes a factor of causing erroneous operation.

When the electrons and holes generated by the exposure of high-energy rays exist in the electrically neutral range of the semiconductor device, the electrons and holes are recombined with time and a large influence is not exerted on the operation. In contrast, when the irradiation position is in the depletion layer as the electrically neutral region, the generated electrons and holes exert an adverse influence on the device operation. Thus, although the irradiation position cannot be controlled, as a countermeasure, the width of the depletion layer formed near the pn junction can be narrowed.

The position of exposure in the semiconductor device, that is, an exposure ratio is proportional to the area ratio in statistics. With respect to the peripheral portion, the width of the depletion layer is multiplied with the length of the peripheral portion to calculate a substantial exposure area. In the case of the micro-structure MOS, for example, when impurity atoms are ion-implanted from a diffusion window whose one side is 0.14 micron to thereby form a pn junction for forming the source/drain areas, the plane area of the pn junction is 0.0196 square micron. In contrast, when it is assumed that the width of the depletion layer is 0.1 micron, the area formed by the depletion layer in the peripheral portion is 0.056 square micron. That is, in the case of the latest micro junction, the area ratio between the center portion and the peripheral portion is about 1:3, and the area of the peripheral portion is larger. Consequently, the conventional layer-shaped breakwater cannot sufficiently deal with exposure in the peripheral portion and occurrence of soft errors. Therefore, a technique of effectively enhancing resistance also to high energy rays incident from any directions and positions is necessary.

It can be generally said that when a high-density region is formed so as to surround the pn junction, the width of the depletion layer can be uniformly reduced. In the case of a vertical structure MOSFET, such a structure can be designed so that the operation of a MOS can be performed. In a horizontally-long MOSFET, the region between the source and the drain becomes a high-density region of an opposite conduction type. Consequently, the threshold of the MOSFET becomes remarkably high, and it is unpreferable for designing of a higher-performance MOSFET. To be specific, when the operation voltage is decreased in accordance with the trend of a lower voltage, to maintain the drain current and mutual conductance at large values and to set the impurity density in the peripheral portion to be high are contradictory.

BRIEF DESCRIPTION OF THE DRAWINGS

FIG. 1 is a schematic diagram showing a section of a representative configuration example of a conventional ultra-small MOSFET.

FIG. 2A is a circuit diagram showing a complementary circuit configuration (CMOS), FIG. 2B is a circuit diagram showing a circuit configuration of a memory device (SRAM) using the complementary circuit configuration, and FIG. 2C is a circuit diagram showing a circuit configuration of an SRAM to which a capacitance Ca as a countermeasure against alpha particles is added

DESCRIPTION OF THE PREFERRED EMBODIMENTS

From the viewpoint of pursuing higher performance of a MOS and an SRAM as a typical target to which the MOS is applied, in a MOS based on the invention, the general source/drain diffusion layer shown in FIG. 1 basically has a diffusion layer double structure constructed by a deep diffusion layer for reduction in resistance and a shallow diffusion layer as a countermeasure against a punch-through.

Considering that the positions of generation of electrons and holes causing a soft error are limited in a depletion layer, the basic concept of the present invention is to uniformly narrow the width of a depletion layer. The width W of the depletion layer and density N of impurity doped in the semiconductor satisfy the relation shown in Expression 1.

$$W \propto \frac{1}{\sqrt{N}} \quad (1)$$

To narrow the width W of the depletion layer, it is sufficient to set the impurity density to be high. However, when a high density doped area is formed in the whole semiconductor device, the mobility of carriers becomes low and it causes deterioration in high-speed operation.

Figure 3:
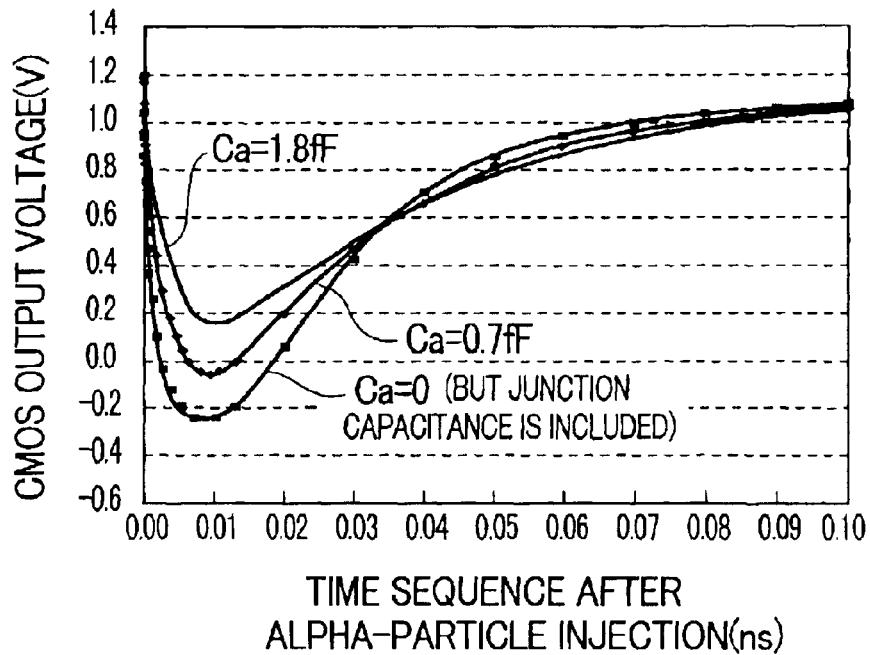
FIG. 3 is a graph showing an example of analysis performed by device simulation, of changes in an output when the device is irradiated with alpha particles in the case where the capacitance Ca is added to the output side of the CMOS.
Figure 4:
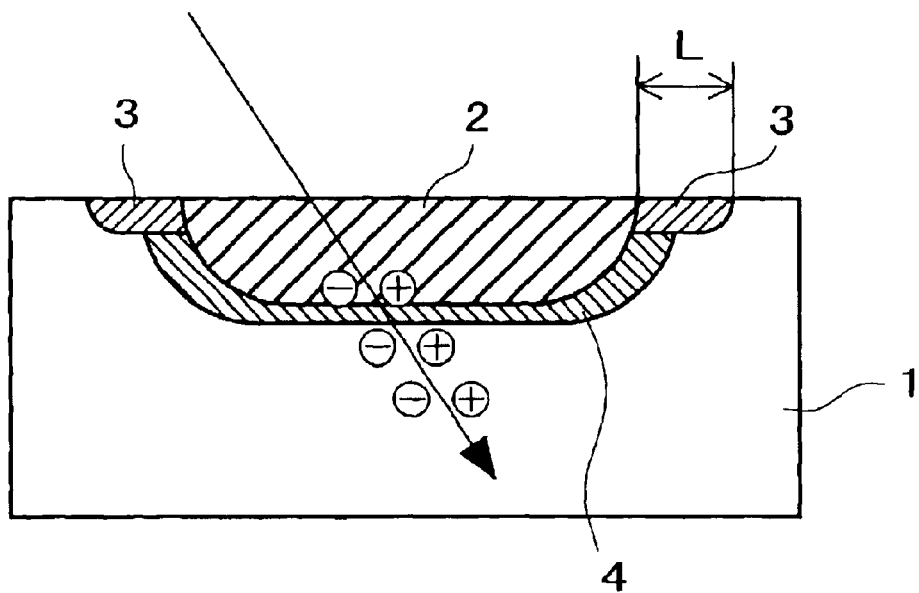
FIG. 4 is a diagram schematically showing a state where a pn junction is irradiated with alpha particles.

According to the invention, therefore, as shown in FIG. 4, in the structure having the region 1 of the first conduction type, the impurity region 2 of the second conduction type of high density and deep diffusion, and the impurity region 3 of the second conduction type of shallow diffusion, as a pn junction forming the source/drain region, the impurity region 4 of the first conduction type of density higher than the impurity density of the region 1 of the first conduction type is provided between the region 1 of the first conduction type and the region 2 of the second conduction type. With the configuration, the width of the depletion layer formed between the region 1 of the first conduction type and the region 2 of the second conduction type can be set to be narrow and uniform.

Figure 5:
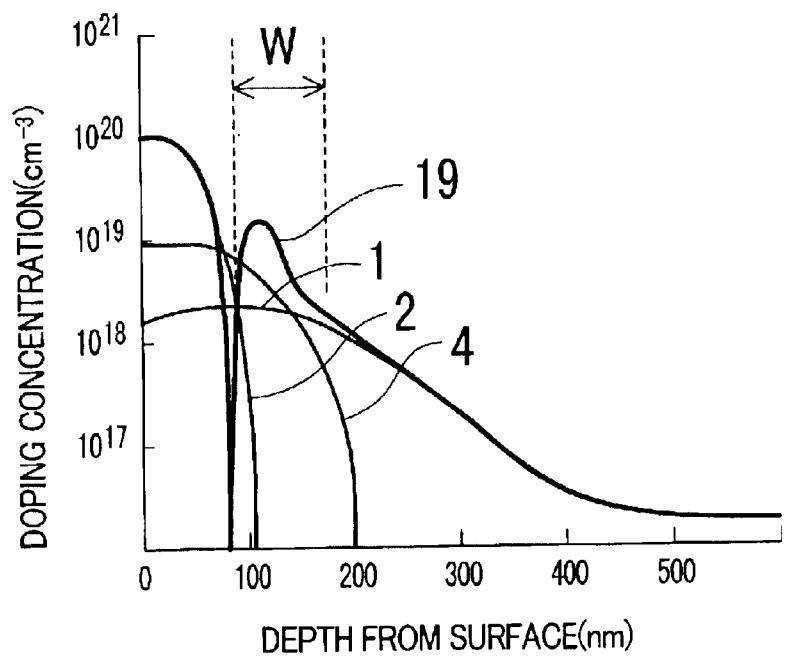
FIG. 5 is a diagram showing an impurity density distribution of a semiconductor device of FIG. 4.

FIG. 5 is a graph showing an impurity density distribution of the semiconductor device of FIG. 4. In FIG. 5, an impurity density distribution 1 is a density distribution in the depth direction of the semiconductor device 1 of the first conduction type, an impurity density distribution 2 is a density distribution in the depth direction of the semiconductor region 2 of the second conduction type having a long diffusion length, and an impurity density distribution 4 is a density distribution of the impurity region 4 of the first conduction type for shortening the width of the depletion layer according to the invention. The difference between the diffusion depth indicated by the foot of the impurity density distribution 4 and the diffusion depth indicated by the foot of the impurity density distribution 2 is defined as W in the specification. In FIG. 5, the distribution indicated by the thick curve 19 denotes a density distribution obtained by compensating the impurity densities of the first and second conduction types with each other.

As a method of forming the region 4, when a mask having a diffusion window which is the same as that used for forming the region 2 is used, the region 4 can be formed so as to surround the region 2. Since the oncoming directions of cosmic rays causing soft errors do not have an order at all, if the region 4 can be formed so as to surround the depletion layer formed between the region 1 of the first conduction type and the region 2 of the second conduction type, resistance to the disorder of the oncoming directions can act uniformly and effectively.

In order to use the structure of FIG. 4 as the source or drain of the MOSFET, since the region 1 of the first conduction type functions as the substrate of the MOSFET, at least a part of the region 3 of the second conduction type has to penetrate the region 4 and reach the region 1 of the first conduction type. Otherwise, the high-density region 4 determines the threshold voltage of the MOSFET, and the threshold voltage changes to be higher than the original threshold voltage determined by the semiconductor substrate 1. From the viewpoint of the MOSFET characteristics, when the density of the deep diffusion region 4 is designed to be high, the threshold voltage of the MOSFET becomes high and the drain current and mutual conductance are decreased. This is unpreferable from the viewpoint of designing of the MOSFET.

As a method of solving the problem, when the penetration condition, that is, the condition that at least a part of the region 3 of the second conduction type penetrates the region 4 and reaches the region 1 of the first conduction type is satisfied, the region 1 of the first conduction type functions as the substrate of the MOSFET, and higher performance as a horizontally-oriented MOSFET can be achieved. Therefore, when the length of the penetration portion in the horizontal direction to the deep diffusion region 2 of the shallow diffusion region 3 is defined as "L" in FIG. 4, the penetration condition is expressed as Expression 2.

$$L > W \quad (2)$$

In consideration of application to a short channel MOS, it is practical to also use a structure in which a locally high-density doped region of the first conduction type called the pocket 5 in the conventional structure shown in FIG. 1 is provided, and it does not check the effects of the present invention. Obviously, the structure of employing also the pocket is a part of the present invention.

Figure 7A:
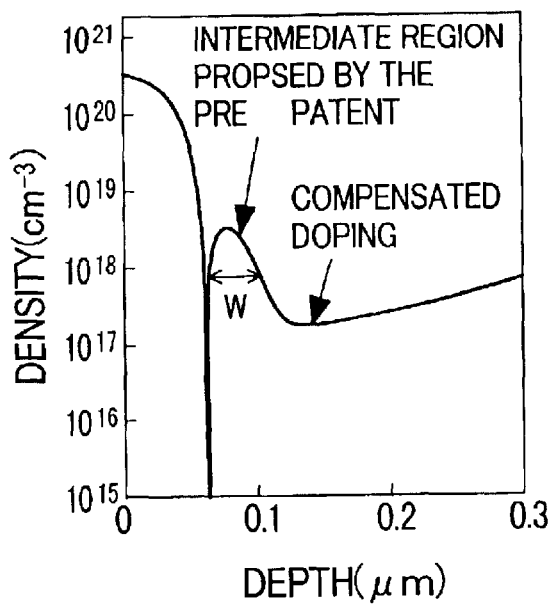
FIG. 7A is a diagram showing a distribution of density of impurity in a pn junction of a structure example of the invention.
Figure 7B:
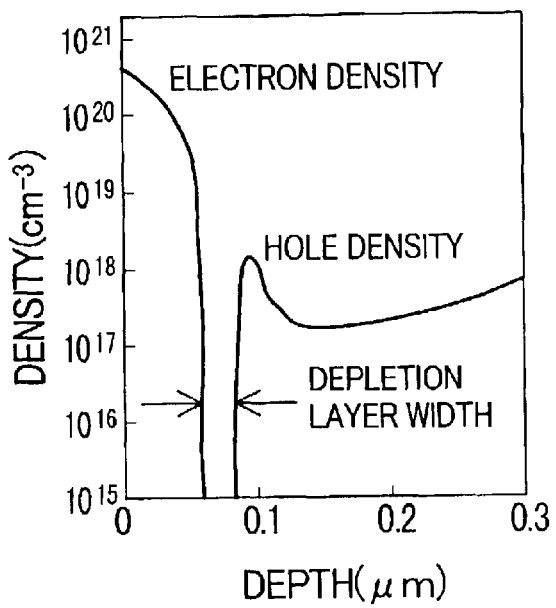
FIG. 7B is a diagram showing the relations among electron and hole density distributions obtained by the device simulation and the depletion layer.
Figure 8A:
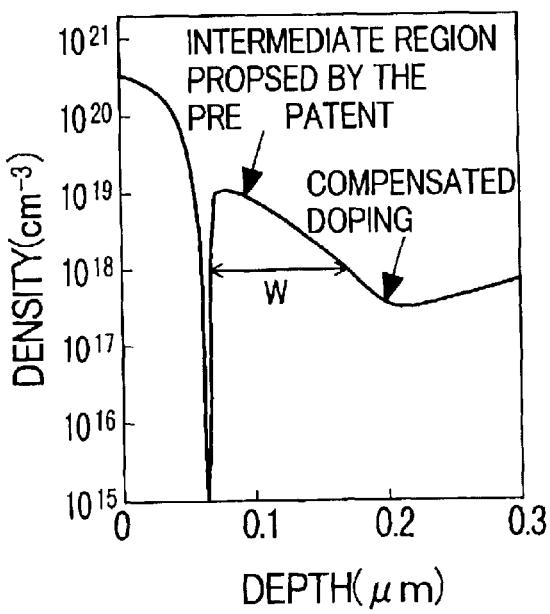
FIG. 8A is a diagram showing a distribution of density of impurity in a pn junction of another structure example of the invention.
Figure 8B:
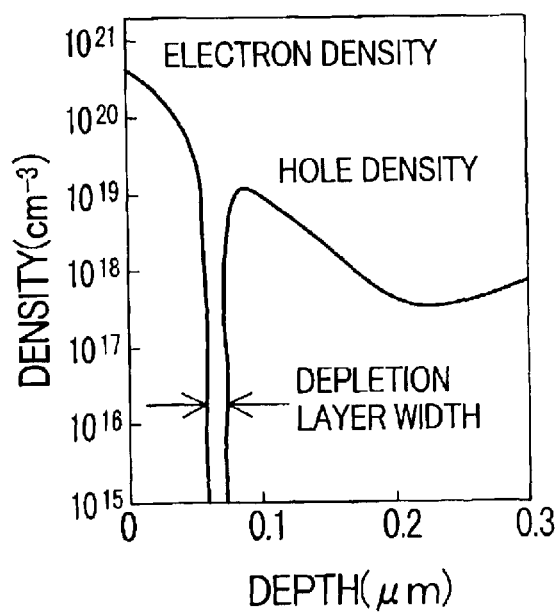
FIG. 8B is a diagram showing the relations among electron and hole density distributions obtained by the device simulation and the depletion layer.

The relation between the impurity density distribution and the depletion layer will now be described with respect to the conventional structure shown in FIGS. 6A and 6B and the improved structures of the present invention shown in FIGS. 7A and 7B and FIGS. 8A and 8B. Each of FIGS. 6A, 7A, and 8A shows the impurity density distribution and each of FIGS. 6B, 7B, and 8B shows the electron and hole density distributions obtained by device simulation.

Figure 6A:
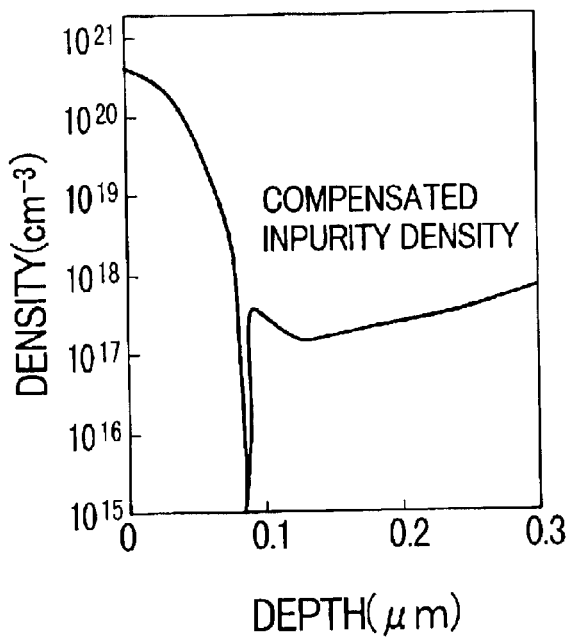
FIG. 6A is a diagram showing a distribution of density of impurity in a pn junction of a conventional structure.
Figure 6B:
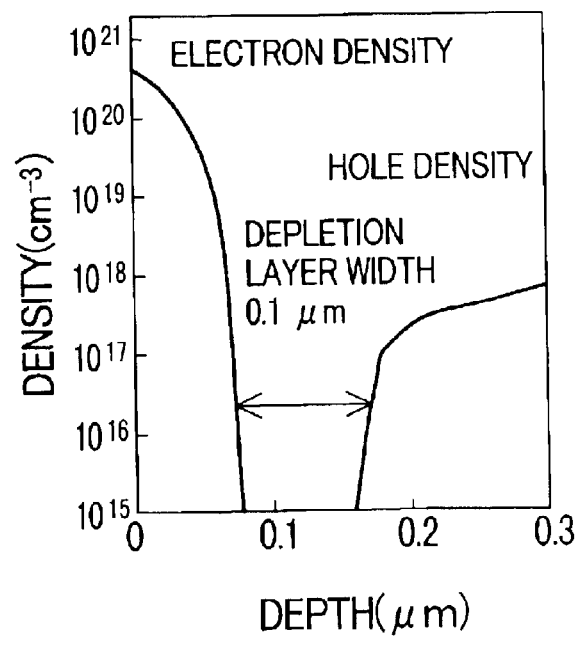
FIG. 6B is a diagram showing the relations among electron and hole density distributions obtained by the device simulation and a depletion layer.

In the conventional structure shown in FIGS. 6A and 6B, as shown in FIG. 6A, a peak is hardly seen in the impurity density corresponding to the compensated impurity density 19 shown in FIG. 5 and the width of the depletion layer shown in FIG. 6B is about 0.1 micron. In contrast, in each of FIGS. 7A and 8A, by providing the high-density region 4 of the invention, a peak conspicuously appears in the width W in the impurity density corresponding to the compensated impurity density 19 shown in FIG. 5 and the width of the depletion layer is remarkably reduced. Quantitatively, when the width of the impurity density is as shown in FIG. 7A, the width of the depletion layer shown in FIG. 7B is less than 0.02 micron. When the width of the impurity density is further widened by about twice as shown in FIG. 8A, the width of the depletion layer shown in FIG. 8B is reduced to about 0.01 micron.

Figure 9:
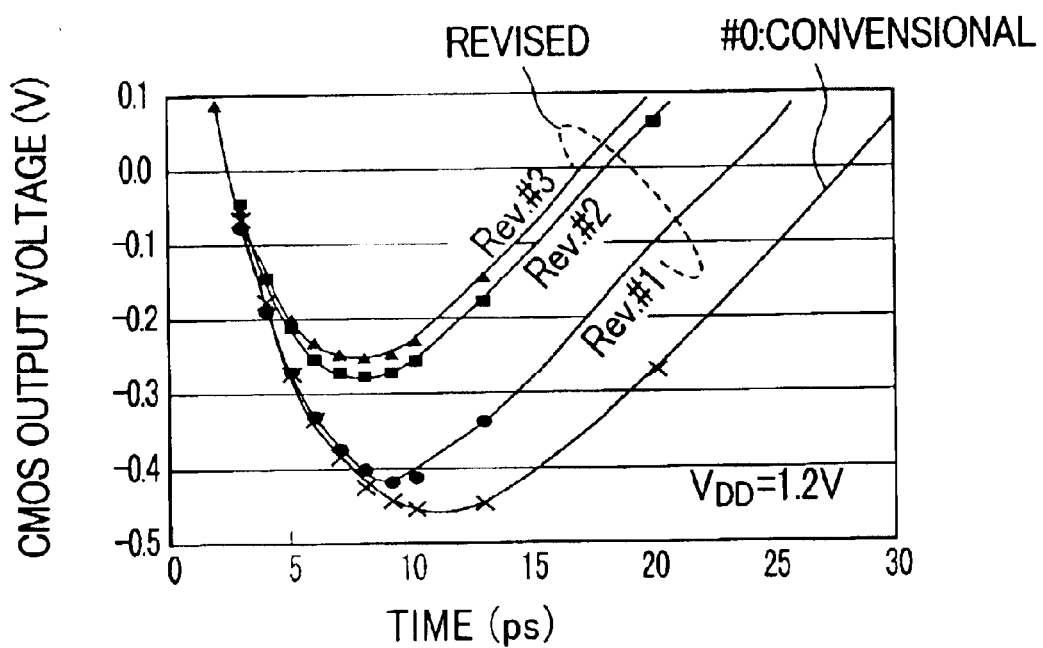
FIG. 9 is a graph showing an example of results of analysis by computer simulation of an improvement effect by reduction in the width of a depletion layer according to the invention.

FIG. 9 shows results of analysis conducted by computer simulation of results of improvement by reduction of the width of the depletion layer in accordance with the invention. In the CMOS circuit shown in FIG. 2A and the bistable circuit SRAM shown in FIG. 2B constructed by using two CMOSs, device simulation is executed on assumption that the drain electrode of an n-conduction type MOSFET which is at a high potential in an initial state is irradiated with alpha particles, and the output potential of the CMOS with a lapse of time is shown. It is assumed that the drain electrode is irradiated with alpha particles at 80 degrees from the direction perpendicular to the surface of the semiconductor device, that is, almost from the horizontal direction. As a result, the alpha particles enter the depletion layer almost parallelly so that the distance of propagation in the depletion layer becomes long. Therefore, a situation almost the worst with respect to occurrence of a soft error is assumed.

In FIG. 9, #0 denotes a characteristic of the conventional structure shown in FIG. 6. It shows that the output potential of the CMOS which was high dropped to a negative potential with time. The minimum potential is about −0.5V. On the other hand, in the semiconductor device having a high-density region of the invention, as shown by improved characteristics #1, #2, and #3 in FIG. 9, the minimum potential is higher than that of the conventional characteristic. In other words, the resistance to alpha particles is improved. The improved characteristics #1, #2, and #3 are obtained by designing while changing the width W of the high-density region according to the invention, and the thickness increases in order of #1, #2, and #3. The improved characteristic #2 shows a high-density region impurity distribution shown in FIG. 8A in which the width W of the high density region is a little less than 0.1 micron. The improved characteristic #3 shows a case where the width W of the high-density region is designed to be larger than that for obtaining the improved characteristic #2. However, the electric characteristic is not so improved as shown in FIG. 8B. It denotes that the width of the depletion layer is not reduced so much and an effect of the improvement in the characteristic is accordingly small. Therefore, it is practical to set the width W of the high-density region according to the invention to be a little less than 0.1 micron.

In the case of the latest ultra-small MOSFET, the highest value of density of the semiconductor substrate 1 is around $1 \times 10^{18}$ cm$^{-3}$. Therefore, to form a high-density region of the invention, the density of the semiconductor substrate has to be higher than that of the conventional one. Generally, the maximum value of the high density region of the invention has to be around $1 \times 10^{18}$ cm$^{-3}$ to $1 \times 10^{20}$ cm$^{-3}$. However, when the density is set to be as high as around $10^{20}$ cm$^{-3}$, a leak current occurs due to Zener breakdown in a pn junction. Consequently, the maximum density is desirably set to about $10^{19}$ cm$^{-3}$. In the example of FIGS. 8A and 8B, the maximum density is set to $1 \times 10^{19}$ cm−3. Although the case where the p conduction type is selected as the first conduction type and the n conduction type is selected as the second conduction type has been described, obviously, the invention is effective when the n conduction type is selected as the first conduction type and the p conduction type is selected as the second conduction type.

The invention will be described in more detail by taking examples. For easier understanding, description will be given with reference to the drawings in which the main portion is shown larger than the other portion. Obviously, the materials, conduction types, fabricating conditions, and the like of the components are not limited to those described in the examples but can be variously modified.

EXAMPLE 1

Figure 10:
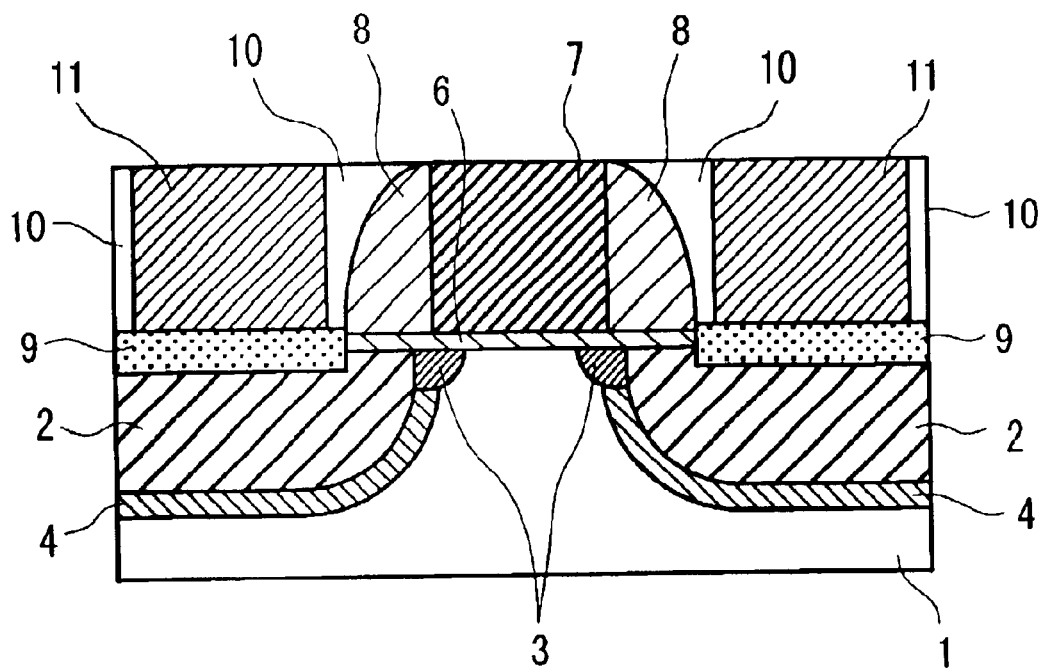
FIG. 10 is a diagram showing a section of a completed MOS according to a first example of the invention.
Figure 11:
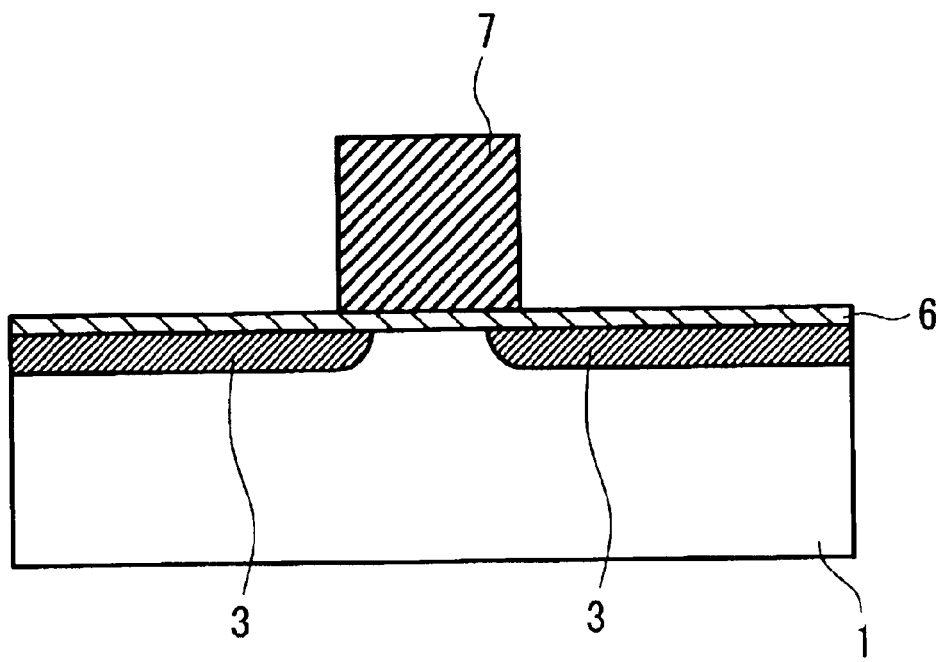
FIG. 11 is a cross section of a MOS at a main stage of a process of fabricating the MOS shown in FIG. 10.
Figure 12:
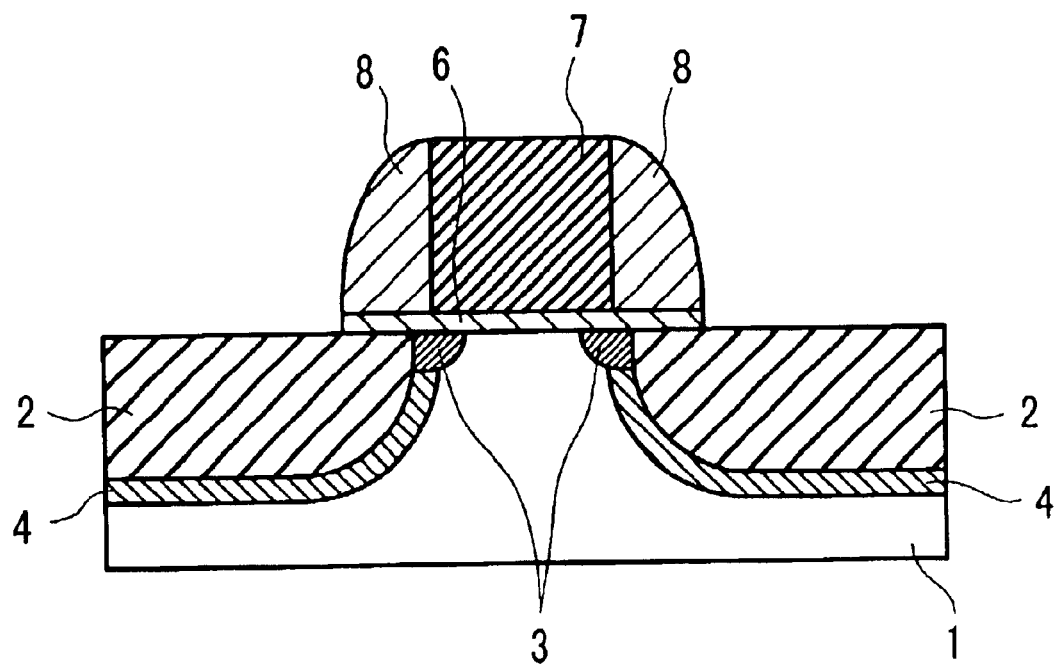
FIG. 12 is a cross section of the MOS at a main stage subsequent to FIG. 11 of the process of fabricating the MOS shown in FIG. 10.

FIG. 10 is a cross section of a complete MOS as a first example of the invention. FIGS. 11 and 12 are cross sections showing main stages in a process of fabricating the MOS.

FIG. 10 shows an ultra short channel MOS having a double-diffusion structure for realizing a low-resistant shallow-junction source/drain and including a semiconductor substrate 1 of a first conduction type, a deep source/drain diffusion layer 2 of a second conduction type, a shallow source/drain diffusion layer 3 of the second conduction type, a high-density impurity region 4 of the first conduction type, a gate insulating film 6, a gate electrode 7, a gate side-wall insulating film 8, a silicide film 9, a passivation insulating film 10, and a source/drain electrode 11. As also described in FIG. 4, the thickness of the impurity region 4 of the first conduction type is suppressed so as not to cover all of the impurity region 3 of the second conduction type having a small diffusion depth. As obviously understood by comparison with the configuration example of the conventional ultra-small MOSFET shown in FIG. 1, the first example is characterized in that the impurity region 4 of the first conduction type covers the deep source/drain diffusion layer of the second conduction type except for a part of the impurity region 3 of the second conduction type of shallow diffusion. Although a pocket 5 is omitted in the first example, even when the pocket 5 is provided, the same effect is obtained.

FIG. 11 is a cross section of a MOS in the substrate at the initial stage of the process of fabricating the MOS in the first example. The semiconductor substrate 1 is an N-conduction-type single crystal Si having a diameter of 20 cm and having a surface orientation (100). Formation of a device isolation insulating region (not shown) defining an active region, implantation of p-conduction type ions for substrate concentration adjustment and heat treatment, and implantation of ions for adjusting a threshold voltage and heat treatment for activation are performed by a conventionally known method. After that, a thermal oxide film having a thickness of 1.8 nm is formed. By nitriding the surface with NO gas, a nitride film of 0.2 nm is stacked to form the gate insulating film 6. Subsequently, an amorphous Si film doped with B (boron) at high density is deposited to a thickness of 250 nm by chemical vapor deposition on the gate insulating film 6 and, after that, processed by using electron beam lithography to form the gate electrode 7 of 100 nm. After forming the gate electrode 7, P (phosphor) ions are implanted in such a state, thereby forming the n-conduction-type, shallow-junction, and high-density source/drain diffusion layer 3. There is no problem to decrease resistance of the gate electrode 7 not by preliminarily doping impurities as described above but by selectively implanting ions of phosphor or boron at high density into a desired region in the gate electrode 7 on the basis of the conventionally known complementary MOS fabricating method.

FIG. 12 is a cross section showing a realized configuration since the stage shown in FIG. 11 up to a stage at which the source/drain electrode 11 is provided.

First, a silicon oxide film having a thickness of 50 nm is deposited on the whole surface at a low temperature of 400° C. by plasma-assisted deposition and is selectively left only on side walls of the gate electrode 7 by anisotropic dry etching, thereby forming the gate side-wall insulating film 8. The n-conduction-type deep-junction source/drain diffusion layer 2 using the gate side-wall insulating film 8 as an ion implantation blocking mask is formed. Further, while using the gate side-wall insulating film 8 as an ion implantation blocking mask, $BF_2$ ions are implanted from the perpendicular direction under conditions of acceleration energy of 20 keV and a dosage of $2\times10^{14}/cm^2$, thereby forming the high-density impurity layer 4 of the p conduction type as the feature of the invention between the p-conduction-type region 1 and the n-conduction-type region 2. The order of implantation of the n-conduction-type ions and implantation of the p-conduction type ions using the gate side-wall insulating film 8 as an ion implantation blocking mask may be reversed.

After realizing the configuration of FIG. 12, the implanted ion activating heat treatment is performed under conditions of 1000° C. and one second. A Co film is thinly deposited on the whole surface by sputtering and silicified by short-time annealing at 500° C. An unreacted Co film is removed by an aqueous solution of hydrochloric acid and hydrogen peroxide and the Co silicide film 9 is selectively left on an Si substrate exposed portion. In this state, the resistance of the Co silicide film 9 is lowered by short-time heat treatment at 800° C. Subsequently, a thick silicon oxide deposition film is formed on the whole surface and, after that, the surface of the film is planarized by mechanical chemical polishing, thereby forming the passivation insulating film 10. An opening is formed in a desired region in the passivation insulating film, a TiN film serving as a diffusion barrier material of wiring metal and a W film as a wiring metal are deposited, and the W film is selectively left only in the opening portion by planarizing polishing. After that, by deposition of a metal film made of aluminium as a main material and patterning the metal film in accordance with a desired circuit configuration, the source/drain electrode 11 is formed. In such a manner, the MOS of the first example shown in FIG. 10 is fabricated.

When a junction capacitance of the source/drain was measured in order to evaluate the high-density impurity layer 4 in the MOS on the basis of the example, it was recognized that the junction capacitance was increased by about five times by introduction of the high-density impurity layer 4 It is understood that the thickness of the depletion layer shown in FIG. 6B is decreased to the thickness of the depletion layer shown in FIG. 8B.

The junction capacitance is a value which is originally small as compared with the wiring capacitance. Since the increase in the junction capacitance according to the invention is still at a low level as compared with the wiring capacitance, an adverse influence is not exerted on the high speed of the operation.

EXAMPLE 2

Figure 13:
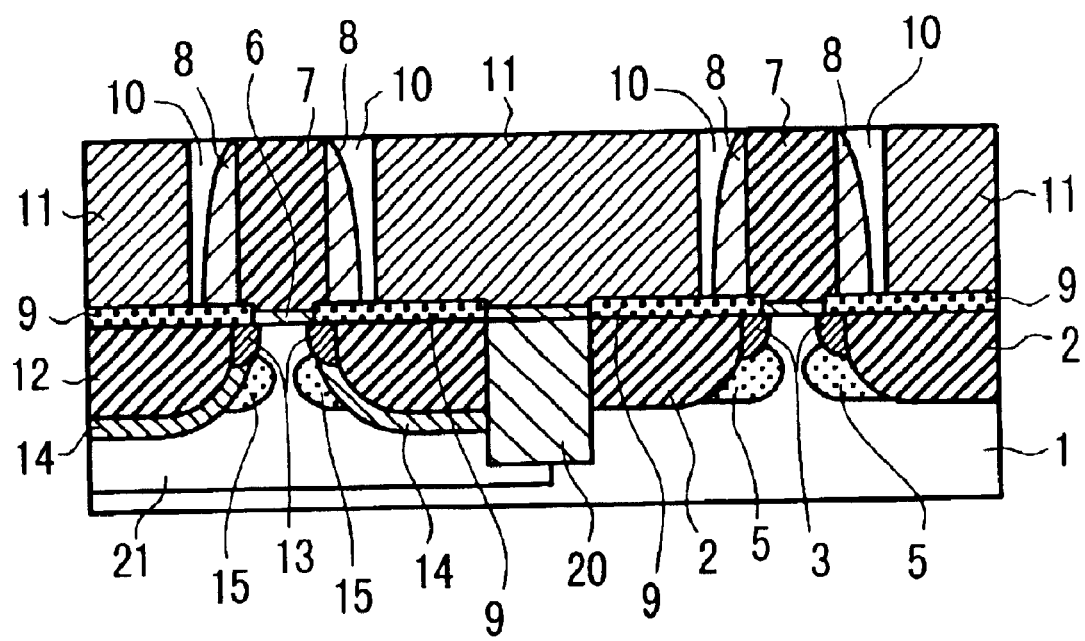
FIG. 13 is a diagram showing a section of a complete CMOS as a second example of the invention.
Figure 14:
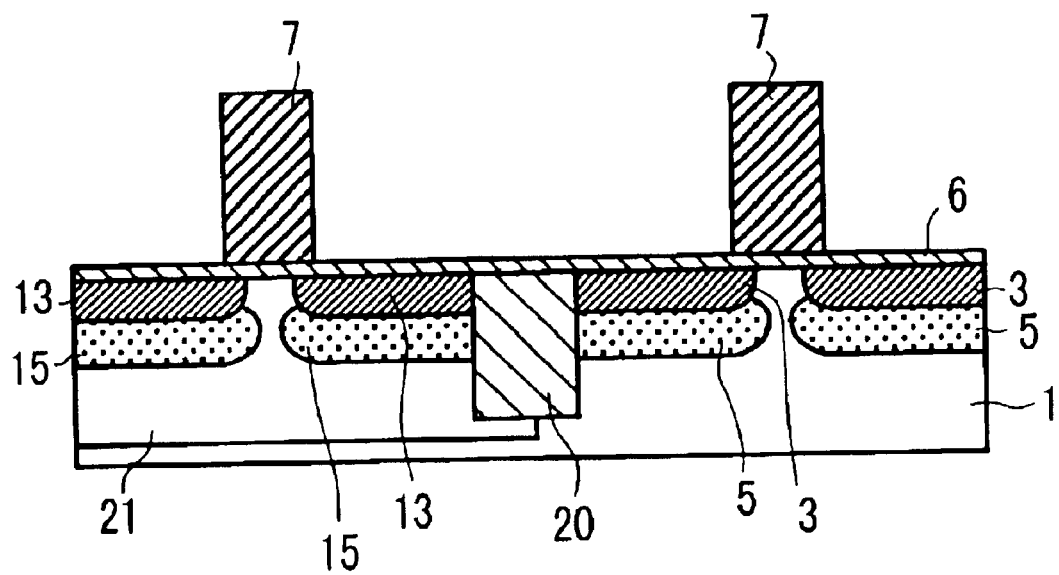
FIG. 14 is a cross section of a CMOS at an initial stage of a process of fabricating the MOS shown in FIG. 15.

FIG. 13 is a cross section of a complete CMOS as a second example of the invention. FIG. 14 is a cross section showing one of CMOSs at the initial stage in a process of fabricating the CMOS.

FIG. 13 shows an ultra micro CMOS having a double-diffusion structure for realizing a low-resistant shallow-junction source/drain and including the semiconductor substrate 1 of the first conduction type (n type), the deep source/drain diffusion layer 2 of the second conduction type (p type), the shallow source/drain diffusion layer 3 of the second conduction type, the high-density impurity region 4 of the first conduction type, the pocket 5 the gate insulating film 6 the gate electrode 7 the gate side-wall insulating film 8 the silicide film 9 the passivation insulating film 10 the source/drain electrode 11 a deep source/drain diffusion layer 12 of the first conduction type, a shallow source/drain diffusion layer 13 of the first conduction type, a high-density impurity region 14 of the second conduction type, a pocket 15 a device isolation insulating region 20 and a well region 21 of the second conduction type. By the device isolation insulating region 20 a PMOS is formed on the right side and an nMOS is formed in the p conduction type well region 21 on the left side. In the example, the impurity region 4 of high density is not provided in the pMOS. Although it is preferable to provide the region 4 as a countermeasure against alpha particles, because of low mobility of the pMOS, even if the region 4 is not provided, there is no problem in practice. Consequently, the region 4 is omitted so as not to increase the number of processes.

In the second example, in a manner similar to a known CMOS, a symmetric structure is employed. Therefore, the source/drain electrode 11 in the connection portion of the PMOS and nMOS is commonly used. In the example as well, as also described in FIG. 4, the thickness of the impurity region 14 of the second conduction type is suppressed so that the impurity region 14 of the second conduction type does not cover all of the impurity region 13 of the first conduction type whose diffusion depth is small.

FIG. 14 is a cross section of one of CMOSs in the substrate at the initial stage of the process of fabricating the CMOS in the second example. The semiconductor substrate 1 is a single crystal Si having a diameter of 20 cm of the N conduction type and having a surface orientation (100) Formation of the device isolation insulating region 20 (the device isolating insulating region between CMOSs is not shown) defining an active region, formation of the p-conduction-type well region 21 implantation of n-conduction type ions for density adjustment to the n-conduction-type substrate region, implantation of ions for adjusting a threshold voltage into the regions near the surface of the substrate of the p conduction type and the n conduction type and, further, heat treatment for activating the implanted ions are performed in accordance with a conventionally known method. After that, the gate insulating film 6 and the gate electrode 7 are formed according to the same method as that in Example 1.

Subsequently, while covering the device except for the surface of the n-conduction-type substrate region with a photoresist film (not shown), $BF_2$ ions are selectively implanted into the region, thereby forming the high-density shallow source/drain diffusion layer 3 of the p conduction type. Further, P ions are implanted so as to cover the shallow source/drain diffusion layer 3 thereby forming the n-conduction-type punch-through preventing diffusion layer (pocket) 5 for preventing punch-through. After that, the photoresist film used as the ion implantation blocking mask is selectively removed, the device other than the p-conduction-type well region 21 is covered with the photoresist film (not shown), As ions are selectively implanted into only the p-conduction-type well region 21 thereby forming the high-density shallow source/drain diffusion layer 13 of the n conduction type. The As ion implantation conditions are set as the acceleration energy of 5 keV and a dosage of $2\times10^{15}/cm^2$. Further, B ions are implanted so as to surround the shallow source/drain diffusion layer 13 to thereby form the p-conduction-type punch-through prevention diffusion layer (pocket) 15 for preventing punch through.

After realizing the configuration of FIG. 14, the photoresist film used for selective ion implantation is removed and, according to the fabricating process of Example 1, the gate side-wall insulating film 8 is formed. After that, the n-conduction-type substrate region surface is covered again with a photoresist film (not shown). The resist film and the side-wall insulating film 8 are used as an implantation blocking mask and As ion implantation is performed under conditions of acceleration energy of 50 KeV and a dosage of $3\times10^{15}/cm^2$ thereby forming the deep high-density source/drain diffusion layer 12 Further, by implanting $BF_2$ ions under conditions of acceleration energy of 20 keV and a dosage of $2\times10^{14}/cm^2$, the p conduction type diffusion layer 14 of the invention is formed between the p conduction type region 21 and the n conduction type region 12. After removing the photoresist film used as the ion implantation blocking mask, the p conduction type well region 21 is covered again with the photoresist film (not shown). By implanting B ions under conditions of the acceleration energy of 5 keV and a dosage of $2\times10^{15}/cm^2$ while using the resist film and the side-wall insulating film 8 as the implantation blocking mask, a deep high-density source/drain diffusion layer 2 is formed. In this state, the heat treatment for activation is performed on the implanted ions under conditions of 950° C. and 10 seconds. Subsequently, according to the Example 1 the Co silicide film 9 is selectively formed, its resistance is lowered, the passivation insulating film 10 is deposited, an opening is formed in a desired region, and a TiN film and a W film serving as wiring metal are deposited and selectively left. After that, according to the desired circuit configuration, the metal film made of aluminium as a main material is deposited and patterned, thereby forming a wiring including the source/drain electrode 11. In such a manner, the CMOS of Example 2 shown in FIG. 13 is fabricated.

In the MOS based on Example 2 there is no large changes in the threshold and the current value of an nMOS as compared with a conventional MOS having no diffusion layer 14 of the present invention, and an increase in the junction capacitance between the source and the drain was recognized. It shows that, by providing the diffusion layer 14 the width of a depletion layer is reduced.

In the nMOS of FIG. 13, evaluation was made with respect to the order of forming the diffusion layers 12 and 14 in which the diffusion layer 14 is formed first and the diffusion layer 12 having a deep source and a deep drain is formed. Although the order of implanting ions was changed, no influence was exerted on the characteristics of the fabricated CMOS. Therefore, with respect to the order of ion implantation, any of the diffusion layers 12 and 14 may be formed first.

EXAMPLE 3

Figure 15:
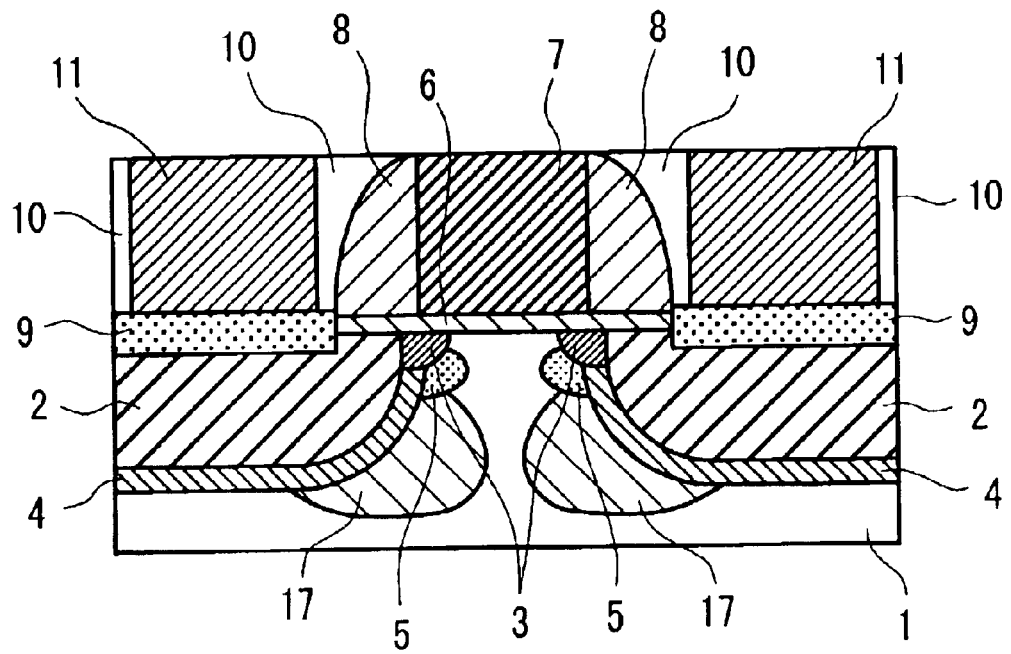
FIG. 15 is a diagram showing a section of a complete MOS as a third example of the invention.
Figure 16:
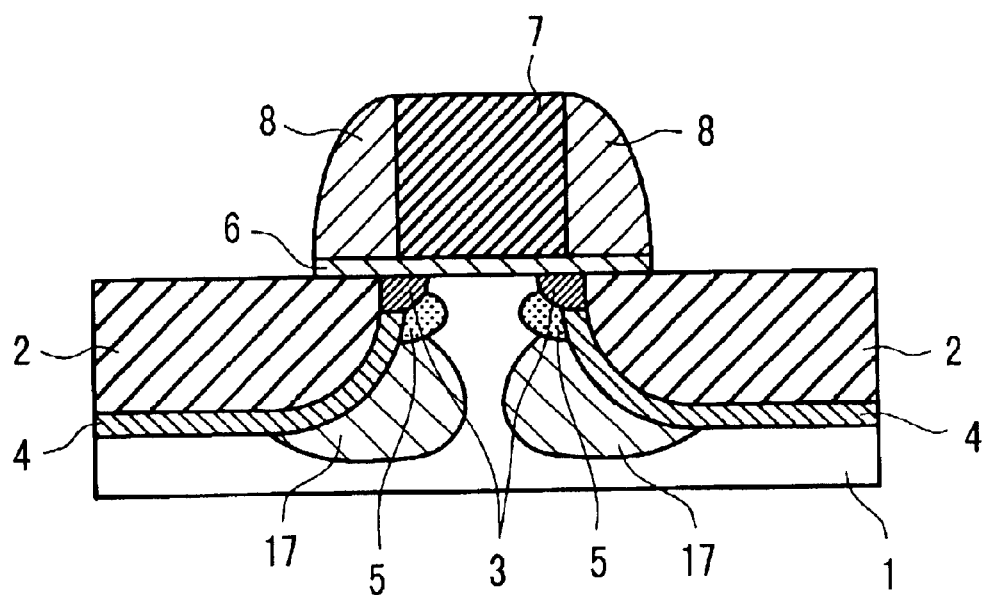
FIG. 16 is a cross section of a MOS at an initial stage of the process of fabricating the MOS illustrated in FIG. 15.

FIG. 15 is a cross section of a complete MOS as a third example of the invention. FIG. 16 is a cross section showing one of MOSs at the initial stage in a process of fabricating the MOS.

FIG. 15 shows an ultra short channel MOS having a double-diffusion structure for realizing a low-resistant shallow-junction source/drain and including the semiconductor substrate 1 of the first conduction type, the deep source/drain diffusion layer 2 of the second conduction type, the shallow source/drain diffusion layer 3 of the second conduction type, the high-density impurity region 4 of the first conduction type, the punch-through preventing diffusion layer 5 of the second conduction type (pocket), the gate insulating film 6 the gate electrode 7 the gate side-wall insulating film 8 the silicide film 9 the passivation insulating film 10 the source/drain electrode 11 and a punch-through preventing diffusion layer (second pocket) 17 of the second conduction type.

As obviously understood from the comparison between FIG. 10 showing Example 1 and FIG. 15 showing Example 3 Examples 1 and 3 are the same with respect to the point that the high-density impurity region 4 of the first conduction type is provided but are different with respect to the point that the pockets 5 and 17 are added in Example 3.

FIG. 16 is a cross section of one of MOSs in the substrate at the initial stage of the process of fabricating the MOS in Example 3 In Example 3, the MOS is fabricated in a manner similar to Example 1 except that, before or after formation of the punch-through preventing diffusion layer 5 of the p conduction type in Example 1 high-energy ion implantation of $BF_2$ is performed so as to form the punch-through preventing diffusion layer 17 of the second p conduction type positioned deeper than the punch-through preventing diffusion layer 5 of the p conduction type. In Example 3 implantation of the p-conduction type ions for adjusting the substrate density and the heat treatment after formation of the device isolation insulating region, which is executed in Example 1 is not performed. After forming the punch-through preventing diffusion layer 17 of the second p conduction type, in a manner similar to Example 1 the gate side-wall insulating film 8 and the n-type high-density source/drain diffusion layer 2 are formed.

After realizing the configuration of FIG. 16, in a manner similar to Example 1 the heat treatment for activating implanted ions, selective formation of the Co silicide film 9 reduction in resistance of the Co silicide film 9 deposition of passivation insulating film 10 formation of an opening in a desired region of the passivation insulating film 10 and deposition and selective etching of the TiN film and the W film as wiring metal are performed. After that, by depositing and patterning a metal film made of aluminium as a main material in accordance with a desired circuit configuration, wiring including the source/drain electrode 11 is formed. In such a manner, the MOS shown in FIG. 15 is fabricated.

Since the punch-through preventing diffusion layer 17 of the second p conduction type is formed in a deep portion of the substrate in the MOS of Example 3 even when the impurity density of the principal surface of the semiconductor substrate 1 is set to be low, a punch-through can be prevented with reliability. Further, since the position of the punch-through preventing diffusion layer 17 of the second p conduction type is different from that of the shallow diffusion layer 3 it is not disturbed that the shallow diffusion layer 3 is formed so as to penetrate the intermediate layer 4. From the viewpoint of the fabricating process, a p conduction type impurity can be implanted after formation of the gate insulating film 6. Consequently, an influence of accelerated by Si in the lattice which occurs in a high-diffusion temperature oxide atmosphere can be eliminated, and a phenomenon that the impurity implanted into the substrate reaches the surface and the surface impurity density increases can be prevented. Therefore, the impurity distribution can be set at extremely low density in the surface and can be set in the substrate at high density, high mobility is achieved, and the punch-through characteristic can be further improved as compared with the MOS of Example 1. In Example 3 the example in which the gate electrode 7 is introduced as an introduction blocking mask with respect to the punch-through preventing diffusion layer 17 of the second p conduction type has been described. It is also possible to provide an offset insulating film on side walls of the gate electrode and use the offset insulating film as an implantation blocking mask. In this case, by controlling the thickness of the offset film, an effect that the implantation position in the gate electrode can be set in a desired position is produced. Further, although the case of the nMOS has been described in Example 3 obviously, it is easily understood that there is no problem to apply the invention to the case of a pMOS of the other conduction type and the case of a CMOS as a composite of the nMOS and pMOS, from the fact that a CMOS can be formed on the basis of Example 1.

EXAMPLE 4

Figure 17:
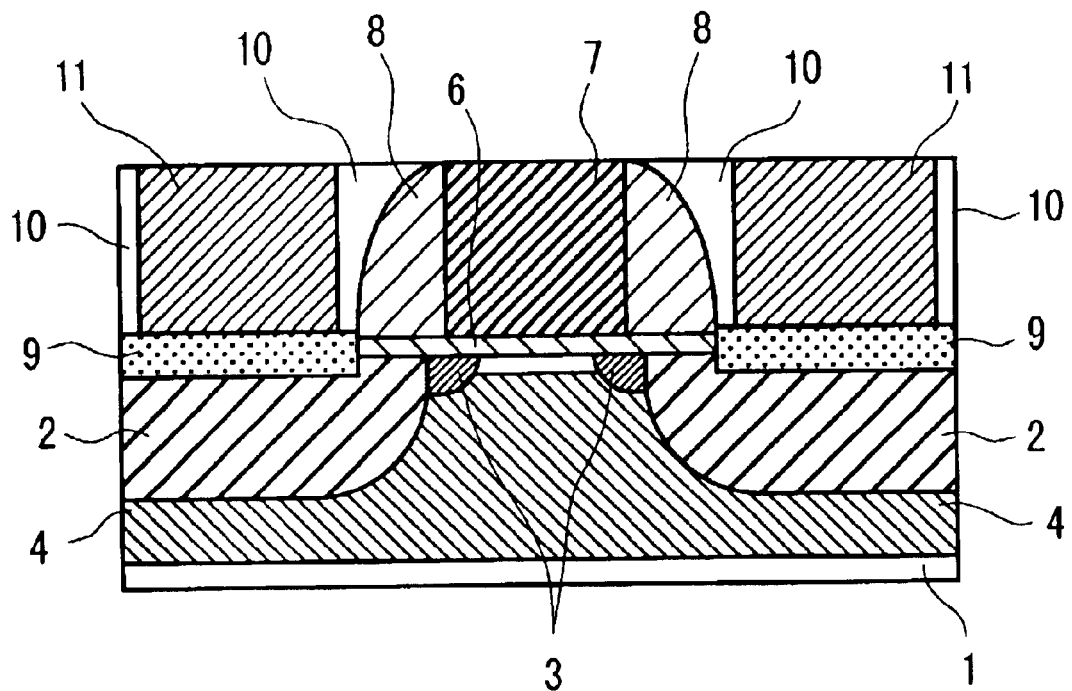
FIG. 17 is a diagram showing a section of a complete MOS as a fourth example of the invention.
Figure 18:
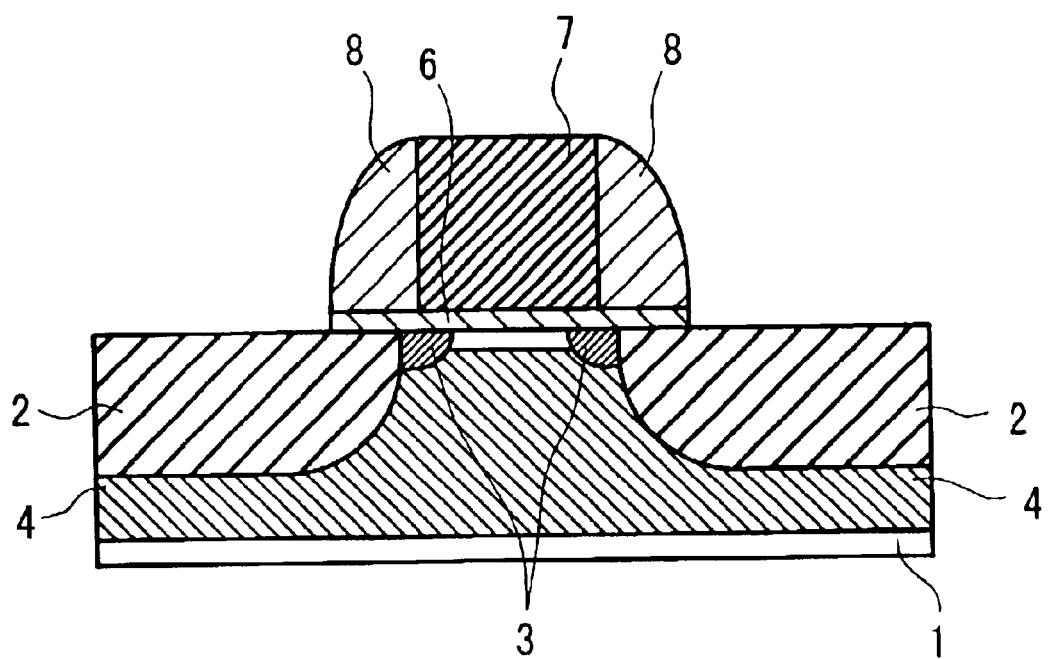
FIG. 18 is a cross section of a MOS at an initial stage in the process of fabricating the MOS illustrated in FIG. 17.

FIG. 17 is a cross section of a complete MOS as a fourth example of the invention. FIG. 18 is a cross section showing one of MOSs at the initial stage in a process of fabricating the MOS.

FIG. 17 shows an ultra micro CMOS having a double-diffusion structure for realizing a low-resistant shallow-junction source/drain and including the semiconductor substrate 1 of the first conduction type, the deep source/drain diffusion layer 2 of the second conduction type, the shallow source/drain diffusion layer 3 of the second conduction type, the high-density impurity region 4 of the first conduction type, the gate insulating film 6 the gate electrode 7 the gate side-wall insulating film 8 the silicide film 9 the passivation insulating film 10 and the source/drain electrode 11

As obviously understood from the comparison between FIG. 10 showing Example 1 and FIG. 17 showing Example 4, in Example 4, the high-density impurity region 4 is formed thick except for the top face portion of the substrate 1 in which the shallow drain/source diffusion layers 3 of the second conduction type face each other.

FIG. 18 is a cross section of one of MOSs in the substrate at the initial stage of the process of fabricating the MOS in Example 4.

In Example 4, the MOS is fabricated in a manner similar to Example 1 except that, high-energy ion implantation of $BF_2$ is performed so as to form the diffusion region 4 in the entire surface of the device so that the diffusion region 4 has also the function of the punch-through preventing diffusion layer 17 of the p conduction type which is positioned in a deep portion and formed in Example 3 In Example 4, implantation of the p-conduction type ions for adjusting the substrate density and the heat treatment after formation of the device isolation insulating region, which is executed in Example 1 is not performed. After forming the diffusion layer 4, in a manner similar to Example 1 the gate side-wall insulating film 8 and the n-type high-density source/drain diffusion layer 2 are formed.

After realizing the configuration of FIG. 18, in a manner similar to Example 1 the heat treatment for activating implanted ions, selective formation of the Co silicide film 9 reduction in resistance of the Co silicide film 9 deposition of passivation insulating film 10 formation of an opening in a desired region of the passivation insulating film 10 and deposition and selective etching of the TiN film and the W film as wiring metal are performed. After that, by depositing and patterning a metal film made of aluminium as a main material in accordance with a desired circuit configuration, wiring including the source/drain electrode 11 is formed. In such a manner, the MOS shown in FIG. 17 is fabricated.

In the MOS based on Example 4, the diffusion layer 4 is formed in the whole face of the device, so that a diffusion mask is unnecessary. Since the diffusion layer 4 is formed in a deep portion of the semiconductor substrate 1 so as to function also as a punch-through stopper, the impurity concentration of the principal surface of the semiconductor substrate 1 can be set to be low. Therefore, deterioration in mobility can be checked. Further, since the impurity concentration of the principal surface of the semiconductor substrate 1 is set to be low, the shallow diffusion layer 3 is substantially projected from the region 4, so that the MOSFET operation is not disturbed. Further, the case of the nMOS has been described in Example 4, obviously, the invention can be similarly applied to a pMOS of the other conduction type. On the other hand, in the case of applying the invention to a CMOS, since the diffusion layer 4 can be formed in the same process of forming a source/drain of a MOSFET of the p conduction type or an extension region, there is no problem. Rather, the CMOS can be manufactured at lower cost since the diffusion layer 4 can be formed without a diffusion mask.

EXAMPLE 5

Application to DRAM

Figure 19:
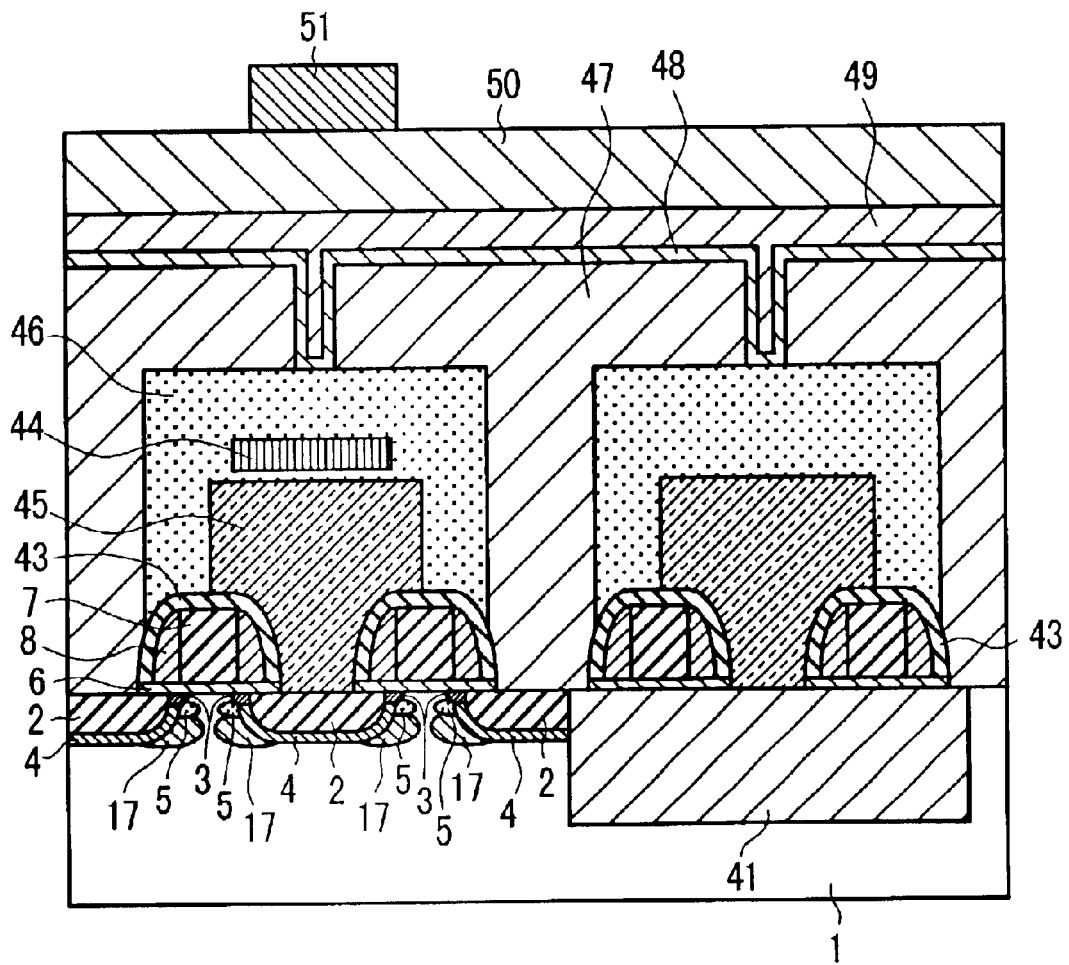
FIG. 19 is a diagram showing a section of a complete DRAM to which a MOS is applied in a fifth example of the invention.
Figure 20:
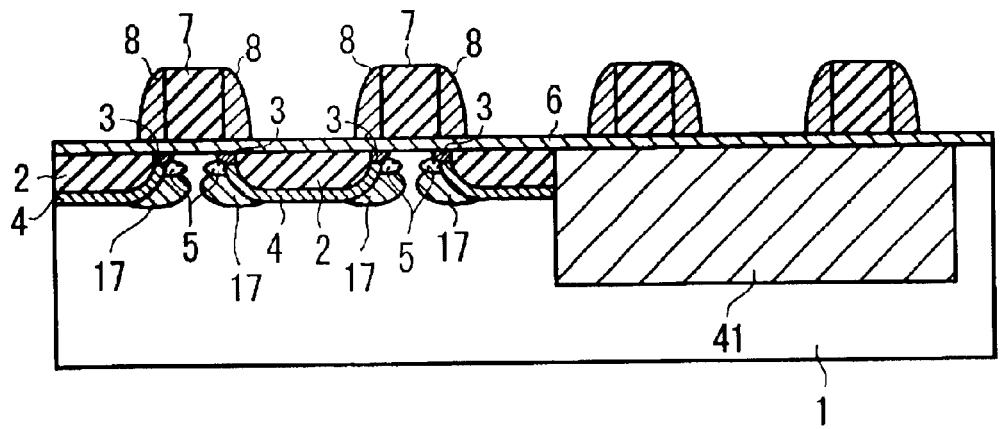
FIG. 20 is a cross section of a MOS at the initial stage in a process of fabricating the MOS illustrated in FIG. 19.

FIG. 19 is a cross section of a complete DRAM to which a MOS as a fifth example of the invention is applied. FIG. 20 is a cross section showing one of MOSs at the initial stage in a process of fabricating the DRAM. In Example shown in FIG. 19, a structure in which the impurity region 4 covers the impurity region 2 of deep diffusion constructing the source/drain region as the feature of the invention is applied to a high packing density DRAM disclosed in Japanese Unexamined Patent Application No. 11-135752 and proposed by the inventors herein.

FIG. 19 shows an ultra short channel MOS having a double-diffusion structure for realizing a low-resistant shallow-junction source/drain and including the semiconductor substrate 1 of the first conduction type, the deep source/drain diffusion layer 2 of the second conduction type, the shallow source/drain diffusion layer 3 of the second conduction type, the high-density impurity region 4 of the first conduction type, the punch-through preventing diffusion layer (pocket) 5 of the second conduction type, the gate insulating film 6 the gate electrode 7 the gate side-wall insulating film 8 the source/drain electrode 11 and the punch-through preventing diffusion layer (second pocket) 17 of the second conduction type. The structure is basically the same as that of the MOS in FIG. 15. In FIG. 19, elements for constructing a DRAM are further added. The elements are an isolation insulating film 41 a silicon nitride film 43 a bit line 44 a polysilicon film 45 an oxide silicon film 46 a bottom electrode 47 a dielectric layer 48 a top electrode 49 an oxide silicon film 50 and a wiring metal 51. In this case, the gate electrode 7 has the function of a word line in the DRAM, and the source/drain 2 of a MOS transistor is connected to the bit line 44 as a stacked film of various silicide films such as a polysilicon film and a tungsten silicide film via a lead electrode made of the polysilicon 45 connected to the source/drain 2

As shown in FIG. 20, by using known photolithography technique and reactive ion etching, the isolation insulating film 41 is formed in a predetermined portion in the semiconductor substrate 1. By a process similar to that of Example 1 the thin oxide silicon film 6 serving as a gate insulating film is formed on the whole surface. After that, a MOSFET is manufactured in accordance with Example 3. Although the upper structure of the DRAM is concretely described in the description of a high packing density DRAM disclosed in Japanese Unexamined Patent Application No. 11-135752, it will be briefly described here. After forming the MOSFET shown in FIG. 20, in such a state, the nitride silicon film 43 for protecting the gate electrode 7 is formed by known CVD. Subsequently, the oxide silicon film 46 having a thickness of 500 nm is formed on the whole surface by using known CVD, a predetermined portion in the formed oxide silicon film 46 is removed by etching, and the removed portion is filled with the polysilicon film 45. Further, a stacked film made by a polysilicon film and a tungsten silicide film is formed by a known method, and an unnecessary portion is removed by etching, thereby forming the bit line 44. The oxide silicon film 46 for protecting the bit line 44 is formed on the whole surface, and a predetermined portion is removed by etching so as to expose the surface of the high-density source region 2. Subsequently, the polysilicon film having a thickness of 600 nm in which phosphor is doped is formed on the whole surface, a predetermined portion is removed by etching to form a groove so as to enlarge the surface area, and the bottom electrode 47 of an accumulated charge capacitance portion is formed. After that, a tantalum oxide film having a thickness of 10 nm is formed as the dielectric film 48 of the accumulated charge capacitance and, further, a tungsten silicide film is formed as the top electrode 49 of the accumulated charge capacitance. Although the tantalum oxide film is used as the dielectric film 48 in the example, a silicon nitride film may be alternately used. Further, the oxide silicon film 50 is formed as a protection film on the whole surface and the wiring 51 is conducted.

In the DRAM of Example 5 the source/drain region 2 is covered with the high-density impurity layer 4, so that a soft error occurrence rate associated with irradiation with alpha particles is low and excellent characteristics of the memory device are therefore obtained.

EXAMPLE 6

Application to Vertical MOS

Figure 21:
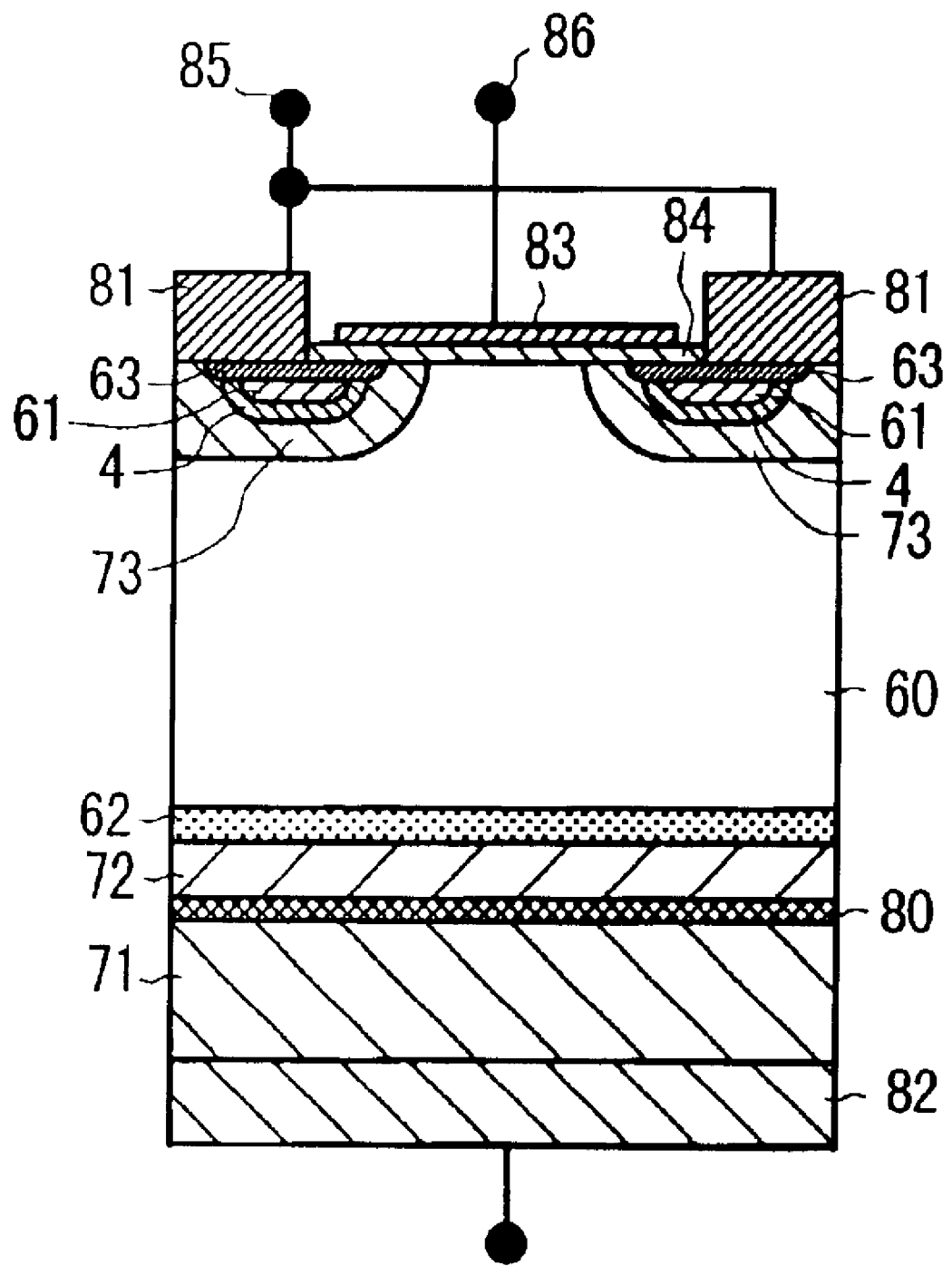
FIG. 21 is a diagram showing a complete vertical MOS as a MOS of a sixth example of the invention.

FIG. 21 is a cross section of a complete vertical MOS according to a sixth example of the invention. In the structure of Example 6 shown in FIG. 21, a structure of providing an impurity region covering an impurity region constructing a source/drain region as a feature of the present invention is applied to a vertical MOS disclosed in Japanese Unexamined Patent Application No. 9-82955 filed by the applicant of the present invention. Shown in FIG. 21 are an n-base layer 60, an n-emitter layer taking the form of a deep diffusion layer, an n-buffer layer 62 an n-emitter layer 63 taking the form of a shallow diffusion layer, a p-collector layer 71, a second p-collector layer 72, a p-base layer 73, a polysilicon layer 80 an emitter electrode 81 a collector electrode 82 a gate electrode 83 a gate oxide film 84 an emitter terminal 85, a gate terminal 86, and a collector terminal 87. Reference numeral 4 denotes the high-density impurity layer as a feature of the invention, which is formed so as to cover the n-emitter layer 61 while a part of the shallow emitter layer 63 is projected. The whole structure and operations are concretely described in Japanese Unexamined Patent Application No. 9-82955. The structure of covering the n-emitter layer 61 of Example 6 with the high-density impurity layer 4 can be realized by a procedure equivalent to that described in FIG. 4. With the configuration, the vertical MOS having a low soft error occurrence probability associated with irradiation of alpha particles can be realized in a manner similar to Examples 1 to 5.

According to the invention, an intermediate layer is formed so as to surround the source/drain high-density diffusion layer, so that the thickness of a depletion layer which is created in the source/drain pn junction can be evenly reduced. Thus, improved resistance to soft errors caused by exposure to high-energy rays when cosmic rays such as alpha particles enter from any directions can be achieved.

What is claimed is:

1. A semiconductor device in an insulated gate field-effect transistor in which a first pn junction is formed between a deep high-density impurity region doped with a second conduction type impurity and a semiconductor substrate including a first conduction type impurity region, said first conduction type impurity region having a predetermined principal surface, and in which a second pn junction is formed between a shallow high-density impurity region doped with the second conduction type impurity and said semiconductor substrate, wherein an intermediate region of the first conduction type impurity whose concentration is higher than that of said first conduction type impurity region of said semiconductor substrate is formed between said first conduction type impurity region of said semiconductor substrate and said deep second conduction type impurity region, and wherein the shallow high-density impurity region doped with the impurity of the second conduction type is projected to extend through at least a part of said intermediate region to the impurity region of the first conduction type in said semiconductor substrate.

2. The semiconductor device according to claim 1, wherein said intermediate region is formed between a deepest region of said deep second conduction type impurity region and said semiconductor substrate.

3. The semiconductor device according to claim 1, wherein the highest concentration of the impurity region of the first conduction type of said intermediate region formed between said impurity region of the first conduction type of said semiconductor substrate and said deep impurity region of the second conduction type lies in a range from $1\times10^{18}$ $cm^{-3}$ to $1\times10^{20}$ $cm^3$.

4. The semiconductor device according to claim 3, wherein the maximum width of the impurity region of the fist conduction type of said intermediate region formed between said impurity region of the first conduction type of said semiconductor substrate and said deep impurity region of the second conduction type is 0.1 micron or less.

5. The semiconductor device according to claim 3, wherein an impurity of the impurity region of the first conduction type of said intermediate region formed between the impurity region of the first conduction type of said semiconductor substrate and the deep impurity region of the second conduction is B or In.

6. The semiconductor device according to claim 3, wherein a locally high-density doping region is formed as a punch-through preventing diffusion layer in a position deeper than said shallow high-density impurity region.

7. The semiconductor device according to claim 1, wherein the maximum width of the impurity region of the first conduction type of said intermediate region formed between said impurity region of the first conduction type of said semiconductor substrate and said deep impurity region of the second conduction type is 0.1 micron or less.

8. The semiconductor device according to claim 7, wherein an impurity of the impurity region of the first conduction type of said intermediate region formed between the impurity region of the first conduction type of said semiconductor substrate and the deep impurity region of the second conduction type is B or In.

9. The semiconductor device according to claim 7, wherein a locally high-density doping region is formed as a punch-through preventing diffusion layer in a position deeper than aid shallow high-density impurity region.

10. The semiconductor device according to claim 1, wherein an impurity of the impurity region of the first conduction type of said intermediate region formed between the impurity region of the first conduction type of said semiconductor substrate and the deep impurity region of the second conduction type is B or In.

11. The semiconductor device according to claim 10, wherein a locally high-density doping region is formed as a punch-through preventing diffusion layer in a position deeper than said shallow high-density impurity region.

12. The semiconductor device according to claim 1, wherein a locally high-density doping region is formed as a punch-through preventing diffusion layer in a position deeper than said shallow high-density impurity region.

13. A semiconductor device comprising a complementary insulated gate field-effect transistor device including a p-conduction type insulated gate field-effect transistor and an n-conduction type insulated gate filed-effect transistor, comprsing:

said p-conduction type insulated field-effect transistor formed in a device isolation insulating region formed in a part of a semiconductor substrate doped with an n-conduction type impurity having a predetermined principal surface, in which a first pn junction is formed between a deep high-density impurity region including a p-conduction type impurity and an impurity region of an n-conduction type in said semiconductor substrate, and in which a second pn junction is formed between a shallow high-density impurity region including a p-conduction type impurity and an impurity region of an n-conduction type in said semiconductor substrate;

said n-conduction type insulated gate field-effect transistor formed in a well doped with a p-conduction type impurity defined by a device isolation insulating region formed in a part of a semiconductor substrate doped with an n-conduction type impurity having a predetermined principal surface, in which a third pn junction is formed between a deep high-density impurity region doped with the n-conduction type impurity and said well doped with a p-conduction type impurity; and in which a fourth pn junction is formed between a shallow high-density impurity region doped with the n-conduction type impurity and said well doped with a p-conduction type impurity of said semiconductor substrate, wherein, in said n-conduction type insulated gate filed-effect transistor, an intermediate region of the p-conduction type impurity whose density is higher than that of said p-conduction type impurity region of said well is formed between said p-conduction type impurity region of said well and said shallow n-conduction type impurity region, and wherein said high-density impurity region of the n-conduction type impurity is projected through at least a part of said intermediate region to said p-conduction type impurity region of said well.

14. The semiconductor device according to claim 13, wherein said intermediate region is formed between the p-conduction type impurity region of said well and a deepest portion of said deep high density impurity region doped with the n-conduction type impurity.

15. The semiconductor device according to claim 13, wherein a locally high-density doping region is formed as a punch-through preventing diffusion layer in a position deeper than said shallow high-density impurity region.

16. A semiconductor device in an insulated gate field-effect transistor having a first pn junction formed between a deep high-density impurity region doped with an impurity of a second conduction and a semiconductor substrate including a first conduction type impurity having a predetermined principal surface, and having a second pn junction formed between a shallow high-density impurity region doped with the impurity of the second conduction type and said semiconductor substrate including an impurity of a first conduction type having said predetermined principal surface, wherein a layer of an impurity density higher than that of said first-conduction type impurity region is formed in said semiconductor substrate between said deep high-density impurity region of the second conduction type and said semiconductor substrate except for a region near said principal surface of said shallow high-density impurity region doped with said second-conduction-type impurity.

* * * * *